United States Patent
Masuda (10) Patent No.: US 11,309,482 B2
(45) Date of Patent: Apr. 19, 2022

(54) VIBRATING ELEMENT WITH CONDUCTIVE FRAMES

(71) Applicant: Funai Electric Co., Ltd., Osaka (JP)

(72) Inventor: Yuichiro Masuda, Takatsuki (JP)

(73) Assignee: FUNAI ELECTRIC CO., LTD, Osaka (JP)

( * ) Notice: Subject to any disclaimer, the term of this patent is extended or adjusted under 35 U.S.C. 154(b) by 574 days.

(21) Appl. No.: 16/251,678

(22) Filed: Jan. 18, 2019

(65) Prior Publication Data

US 2019/0229257 A1 Jul. 25, 2019

(30) Foreign Application Priority Data

Jan. 19, 2018 (JP) .............................. JP2018-007652

(51) Int. Cl.
| | | |
|---|---|---|
| *H01L 41/107* | (2006.01) | |
| *H01L 41/04* | (2006.01) | |
| *H01L 41/047* | (2006.01) | |
| *F21V 14/02* | (2006.01) | |
| *B81B 7/00* | (2006.01) | |
| *G02B 26/10* | (2006.01) | |

(52) U.S. Cl.
CPC .......... *H01L 41/107* (2013.01); *B81B 7/0006* (2013.01); *F21V 14/02* (2013.01); *G02B 26/105* (2013.01); *H01L 41/044* (2013.01); *H01L 41/0475* (2013.01)

(58) Field of Classification Search
CPC . H01L 41/044; H01L 41/107; H01L 41/0475; B81B 7/0006; F21V 14/02; G02B 26/105
See application file for complete search history.

(56) References Cited

U.S. PATENT DOCUMENTS

| 6,094,289 A | 7/2000 | Moranski et al. |
|---|---|---|
| 2002/0050744 A1 | 5/2002 | Bernstein et al. |
| 2014/0104840 A1* | 4/2014 | Iseki .................. G02B 26/0858 362/259 |

FOREIGN PATENT DOCUMENTS

| CN | 105409144 A | 3/2016 |
|---|---|---|
| IT | UB20155335 A1 | 4/2017 |

(Continued)

OTHER PUBLICATIONS

Extended European Search Report issued in Application No. 19152273.9, dated Aug. 7, 2019 (6 pages).

(Continued)

*Primary Examiner* — Shawki S Ismail
*Assistant Examiner* — Monica Mata
(74) *Attorney, Agent, or Firm* — Osha Bergman Watanabe & Burton LLP (57) ABSTRACT

A vibrating element includes a conductive first frame including a first beam portion and a first support portion supporting one end of the first beam portion, a conductive second frame that includes a second beam portion and a second support portion supporting one end of the second beam portion and is disposed separated from the first frame, an oscillating body that is disposed between another end of the first beam portion and another end of the second beam portion and connects the first beam portion and the second beam portion in an insulated state, and a power-consuming member that is installed on the oscillating body and is supplied with power via the first frame and the second frame.

20 Claims, 5 Drawing Sheets

700-700 cross-sectional view (56) References Cited

FOREIGN PATENT DOCUMENTS

| | | |
|---|---|---|
| JP | 2009-009064 A | 1/2009 |
| JP | 2015-161707 A | 9/2015 |

OTHER PUBLICATIONS

Office Action issued in Chinese Application No. 201910049195.1; dated Oct. 12, 2020 (10 pages).
Office Action in counterpart Japanese Patent Application No. 2018-007652 dated Sep. 14, 2021 (6 pages).

* cited by examiner

500-500 cross-sectional view

FIG. 5
600-600 cross-sectional view

700-700 cross-sectional view

VIBRATING ELEMENT WITH CONDUCTIVE FRAMES

BACKGROUND

Technical Field

One or more embodiments disclosed herein relates to a vibrating element and particularly relates to a vibrating element provided with an oscillating body supported by a beam portion.

Related Art

Conventionally, a vibrating element provided with a mirror portion supported by a beam portion is known (for example, see patent literature 1).

Patent literature 1 discloses a vibrating element provided with a frame, a mirror portion (oscillating body), and a piezoresistive element (power-consuming member). The frame includes a beam portion whereto the mirror portion is installed and a support portion that supports the beam portion. The piezoresistive element is disposed near the mirror portion on the beam portion. The beam portion includes wiring for supplying power to the piezoresistive element from a support-portion side. When supplied with power, the piezoresistive element subjects the mirror portion to vibration driving so as to twist the beam portion.

Patent Literature 1: Japanese Patent Application Publication No. 2009-9064

However, in the vibrating element of patent literature 1, because the wiring for supplying power to the piezoresistive element (power-consuming member) is provided on the beam portion, twisting deformation also arises in the wiring in conjunction with the twisting of the beam portion. Because of this, to prevent continuity failures such as wiring disconnection and shorting that accompany the twisting of the beam portion, it is necessary to, for example, increase a wiring thickness, increase a thickness of the beam portion and provide an insulating material over a wide range, or separate the wiring from other conductive members on the beam portion. Because of this, a wiring structure on the beam portion becomes complex, increasing a difficulty of manufacturing.

SUMMARY

One or more embodiments of the present invention provide a vibrating element that has a simple structure and can be readily manufactured even when power is supplied to a power-consuming member provided on an oscillating body of a beam portion.

A vibrating element according to one or more embodiments of this invention includes a conductive first frame including a first beam portion and a first support portion supporting one end of the first beam portion, a conductive second frame that includes a second beam portion and a second support portion supporting one end of the second beam portion and is disposed separated from the first frame, an oscillating body that is disposed between another end of the first beam portion and another end of the second beam portion and connects the first beam portion and the second beam portion in an insulated state, and a power-consuming member that is installed on the oscillating body and is supplied with power via the first frame and the second frame.

In one or more embodiments of the invention, the power-consuming member that is installed on the oscillating body, which connects the first beam portion and the second beam portion in the insulated state, and is supplied with power via the conductive first frame and the conductive second frame is provided. As such, power can be supplied to the power-consuming member via the first beam portion per se of the first frame and the second beam portion per se of the second frame. Therefore, when supplying power to the power-consuming member provided on the oscillating body of the first beam portion and the second beam portion, there is no need to provide wiring on the first beam portion and the second beam portion. Because of this, a simple structure can be readily manufactured even when power is supplied to the power-consuming member provided on the oscillating body.

In one or more embodiments of the present invention, further provided is a drive unit that is disposed straddling the first support portion and the second support portion and subjects the oscillating body to vibrational driving via the first frame and the second frame. Such a configuration enables a driving force from the drive unit to be transmitted in a balanced manner to the first support portion and the second support portion compared to a situation where the drive unit is disposed only on one side among the first support portion and the second support portion. As a result, the oscillating body can be subjected to stable vibrational driving via the first frame and the second frame.

In one or more embodiments of the present invention, between the first frame and the second frame, a space extending in a second direction substantially orthogonal to a first direction, wherein the first beam portion and the second beam portion extend, is provided in a plane wherein the first support portion and the second support portion are provided, and the first frame and the second frame are disposed having substantial linear symmetry with each other across a centerline of the space extending in the second direction. Such a configuration enables the drive force from the drive unit to be transmitted in a balanced manner to the first support portion and the second support portion. As a result, the oscillating body can be subjected to vibrational driving with greater stability via the first frame and the second frame.

In one or more embodiments of the present invention, further provided is an insulating film that is disposed between the drive unit and the first frame and second frame and at least provides insulation between the drive unit and the first frame. Such a configuration prevents continuity between the first frame and the second frame via the drive unit (lower electrode) in a situation of, for example, a general configuration where the drive unit is formed of an upper electrode, a lower electrode, and a piezoelectric body. If there is continuity between the first frame and the second frame, the first frame and the second frame come to have equal potentials. This prevents the first frame and the second frame from being used as conductive members of a circuit supplying power to the power-consuming member.

In one or more embodiments of the present invention, the drive unit includes a piezoelectric body, an upper electrode provided on an upper face of the piezoelectric body, and a lower electrode provided on a lower face of the piezoelectric body, the vibrating element further provided with first wiring that is connected to the upper electrode and supplies power to the upper electrode, second wiring that is connected to the first frame and supplies power to the first frame, third wiring that is connected to the second frame and fixes the second frame at a predetermined potential, and a conductive portion electrically connecting the second frame and the lower electrode. Such a configuration enables the piezoelectric body to be deformed by the first wiring to subject the oscillating body to vibrational driving. Moreover, by the second wiring and the third wiring, the first frame and the second frame can be used as conductive members of a circuit supplying power to the power-consuming member.

In one or more embodiments of the present invention, in a position of the insulating film interposed by the lower electrode and the second frame, an opening portion disposed with the conductive portion on an inner side is provided. Such a configuration enables the opening portion to provide a portion where the lower electrode does not make surface contact with the insulating film, ensure an empty portion between a surface of the lower electrode and the second frame, and expose a surface of a portion on a second-frame side of the lower electrode. Therefore, the conductive portion can be disposed on the inner side of the opening portion so as to contact both the surface of the lower electrode and the second frame. As a result, the conductive portion and the lower electrode and conductive portion can be caused to make surface contact so the lower electrode and the conductive portion have a reliable electrical connection.

In one or more embodiments of the present invention, the drive unit includes a piezoelectric body, an upper electrode provided on an upper face of the piezoelectric body, and a lower electrode provided on a lower face of the piezoelectric body, and the insulating film is configured to insulate the drive unit and both the first frame and the second frame; the vibrating element further provided with first wiring that is connected to the upper electrode and supplies power to the upper electrode, fourth wiring that is connected to the first frame and supplies power of a predetermined first potential to the first frame, fifth wiring that is connected to the second frame and supplies power of a predetermined second potential that differs from the first potential to the second frame, and sixth wiring that is connected to the lower electrode and supplies power to the lower electrode. Such a configuration enables power to be supplied to both the upper electrode and the lower electrode by the first wiring and the sixth wiring. As such, the piezoelectric body can be deformed to a greater extent than a situation of supplying power to only one among the upper electrode and the lower electrode.

In one or more embodiments of the present invention, further provided are second wiring that is connected to the first frame and supplies power to the first frame and third wiring that is connected to the second frame and fixes the second frame at a predetermined potential, wherein the drive unit includes a piezoelectric body, a first electrode provided straddling an upper face and a lower face of the piezoelectric body in a state of being electrically connected to the second frame, and a second electrode provided on the lower face of the piezoelectric body in a state of being electrically connected to the first frame. Such a configuration enables deformation of the piezoelectric body and power supply to the power-consuming member by two wirings alone. That is, wiring for power supply to the first electrode and the second electrode and wiring for power supply to the power-consuming member can be consolidated to simplify a wiring configuration.

In one or more embodiments of the present invention, the vibrating element is configured to supply power to the power-consuming member by providing a potential difference between the first frame and the second frame. Such a configuration enables a current to be flowed from the first frame to the second frame or from the second frame to the first frame via the power-consuming member. That is, the first frame and the second frame can be used as conductive members of a circuit supplying power to the power-consuming member.

In one or more embodiments of the present invention, the power-consuming member includes at least one among an LED light source, a laser light source, an acceleration sensor, a heater, a temperature sensor, and a coil. Such a configuration enables the power-consuming member to impart various functions to the oscillating body. Specifically, in a situation where the power-consuming member includes an LED light source or a laser light source, the LED light source or the laser light source can be subjected to vibrational driving. As such, by light from the LED light source or the laser light source, a deflection angle of the oscillating body can be readily grasped visually and luminous intensity distribution characteristics (range of radiation) can be varied. In a situation where the power-consuming member includes an acceleration sensor, the acceleration sensor can acquire an acceleration of the driving of the oscillating body. In a situation where the power-consuming member includes a heater, the heater can effectively prevent condensation that may arise near the oscillating body.

In one or more embodiments of the present invention, the first support portion and the second support portion each have, in a plane wherein the first support portion and the second support portion are provided, first portions that extend in a second direction substantially orthogonal to a first direction wherein the first beam portion and the second beam portion extend and have edge portions disposed opposing each other and second portions that support the first beam portion and the second beam portion, protrude in the second direction from the first portions, and have an elongated shape with a smaller width in the first direction than the first portions. Such a configuration causes the second portions, which are on an oscillating-body side of the first portions, to have an elongated shape. As such, the driving force of the drive unit can be more effectively transmitted to the oscillating body compared to a situation where the second portions are formed thicker than the first portions.

In one or more embodiments of the present invention, further provided are an insulated holding member holding the first frame and the second frame in a separated state and a drive unit that subjects the oscillating body to vibrational driving via the first frame and the second frame, wherein the drive unit is provided on one face side of the first support portion and the second support portion, and the holding member is disposed on a face on an opposite side of the drive-unit side of the first support portion and the second support portion and is provided extending along edge portions extending in the same direction as the first beam portion and the second beam portion. Such a configuration enables the holding member to hold the first frame and the second frame in a separated state in a position that does not interfere with the drive unit.

In one or more embodiments of the present invention, further provided are an insulated holding member holding the first frame and the second frame in a separated state and a drive unit that subjects the oscillating body to vibrational driving via the first frame and the second frame, wherein between the first frame and the second frame, a space of a certain width extending in a second direction orthogonal to a first direction, wherein the first beam portion and the second beam portion extend, is provided in a plane wherein the first support portion and the second support portion are provided; and the drive unit, the holding member, and the oscillating body are disposed having substantial linear symmetry across a centerline of the space extending in the second direction. Such a configuration enables the drive force from the drive unit to be transmitted in a balanced manner to the drive unit, the holding member, and the oscillating body. As a result, the oscillating body can be subjected to vibrational driving with greater stability via the first frame and the second frame.

In one or more embodiments of the present invention, further provided is an insulated spacer ensuring the space by contacting the first frame and the second frame. Such a configuration enables the spacer to precisely ensure the space between the first frame and the second frame according to a predetermined size. Moreover, because the spacer can readily ensure the predetermined space between the first frame and the second frame, the vibrating element can be readily manufactured.

In one or more embodiments of the present invention, the first beam portion and the second beam portion respectively have oscillating-body support portions that extend in a direction intersecting a first direction, wherein the first beam portion and the second beam portion extend, in a plane wherein the first support portion and the second support portion are provided and have the oscillating body installed thereon at the other end of the first beam portion and the other end of the second beam portion. Such a configuration enables the oscillating-body support portions to support the oscillating body over a greater area. As such, the oscillating body can be stably supported.

One or more embodiments of the present invention provide a vibrating element that has a simple structure and can be readily manufactured even when power is supplied to a power-consuming member provided on an oscillating body of a beam portion.

DETAILED DESCRIPTION

Embodiments of the present invention will be described in detail below with reference to the drawings. In the following description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

A configuration of a vibrating element 100 of a first embodiment of the present invention is described with reference to FIGS. 1 to 3.

Figure 1:
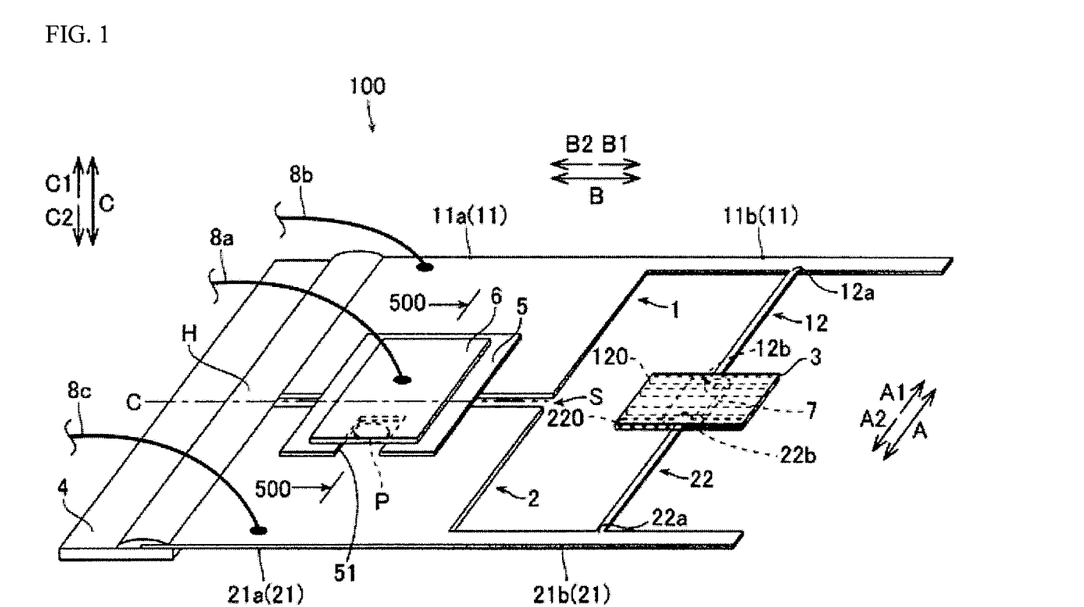
FIG. 1 is a perspective view illustrating a vibrating element of a first embodiment of the present invention.

As illustrated in FIG. 1, the vibrating element 100 according to one or more embodiments of the present invention includes a conductive first frame 1 made of metal, a conductive second frame 2 made of metal, an oscillating body 3, a holding member 4, an insulating film 5, a piezoelectric element 6, and an LED light source 7. Moreover, the vibrating element 100 includes wiring 8a, 8b, and 8c. The piezoelectric element 6 is one example of "drive unit" in the claims. The LED light source 7 is one example of "power-consuming member" in the claims. The wiring 8a, 8b, and 8c are one example of "first wiring," "second wiring," and "third wiring" in the claims.

The first frame 1 and the second frame 2 support the oscillating body 3 in a manner that enables the oscillating body 3 to vibrate. Both the first frame 1 and the second frame 2 are a flat, plate-shaped member. The first frame 1 and the second frame 2 are disposed lined up horizontally in the same plane. The LED light source 7 is disposed on a rear side (opposite side of a reflective-face portion) of the oscillating body 3. The vibrating element 100 is configured to light the LED light source 7 by flowing a direct current to the first frame 1 made of metal and the second frame 2 made of metal. That is, the first frame 1 made of metal and the second frame 2 made of metal function as conductive members of a circuit lighting (supplying power to) the LED light source 7.

The first frame 1 and the second frame 2 are disposed separated by a space S of a certain width extending in a B direction that is described below. No other configuration is disposed between the first frame 1 and the second frame 2, and this portion is empty. The first frame 1 and the second frame 2 are disposed having substantial linear symmetry across a centerline C of the space S extending in the B direction. That is, the first frame 1 and the second frame 2 have symmetrical shapes and are provided with configurations similar to each other.

(Configuration of First Frame)

As illustrated in FIG. 1, the first frame 1 includes a first support portion 11 and a first beam portion 12. The first support portion 11, the first beam portion 12, and an oscillating-body support portion 120 are integrally formed from one conductive substrate made of metal.

The first beam portion 12 has a linearly extending rod shape. Here, a direction wherein the first beam portion 12 extends is defined as an A direction. Within the A direction, a direction heading from the second frame 2 to the first frame 1 is defined as an A1 direction and an opposite direction thereof is defined as an A2 direction. Moreover, a direction orthogonal to the A direction in a plan view is defined as the B direction. That is, a direction orthogonal to the A direction in the plane wherein the first frame 1 (first support portion 11) and the second frame 2 (a second support portion 21 that is described below) are provided is defined as the B direction. The A direction is one example of "first direction" in the claims. Moreover, the B direction is one example of "second direction" in the claims. Moreover, a direction orthogonal to the A direction and the B direction is defined as a C direction. That is, a thickness direction of the first frame 1 and the second frame 2 is defined as the C direction.

The first support portion 11 has a first portion 11a and a second portion 11b. The first support portion 11 is formed roughly in an L shape by the first portion 11a and the second portion 11b.

The first portion 11a has a rectangular shape. The first portion 11a is disposed on one side in the B direction relative to the first beam portion 12. Here, within the B direction, a direction heading from the first portion 11a to the first beam portion 12 is defined as a B1 direction and an opposite direction thereof is defined as a B2 direction. Four edge portions of the rectangular first portion 11a extend in the A direction or the B direction.

The second portion 11b protrudes in the B direction along an edge portion in the A1 direction of the first portion 11a. The second portion 11b has an elongated shape extending in the B direction. A width W1 in the A direction of the second portion 11b is smaller than a width W2 in the A direction of the first portion 11a. Moreover, the width W1 in the A direction of the second portion 11b (see FIG. 3) is less than half the width W2 in the A direction of the first portion 11a (see FIG. 3). The second portion 11b supports one end 12a (A1-direction end portion) of the first beam portion 12 near a center in the B direction of an edge portion on an A2-direction side.

The first beam portion 12 has the oscillating-body support portion 120. The oscillating-body support portion 120 is configured to have the oscillating body 3 installed thereon from one side in the C direction. A direction heading from the oscillating-body support portion 120 to the oscillating body 3 is defined as a C1 direction and an opposite direction thereof is defined as a C2 direction. The oscillating-body support portion 120 is provided at another end 12b (A2-direction end portion) of the first beam portion 12. The oscillating-body support portion 120 has two portions (branching portions) extending in the B1 direction and the B2 direction from the other end 12b of the first beam portion 12. That is, the oscillating-body support portion 120 is an H-shaped portion provided at the other end 12b of the first beam portion 12.

(Configuration of Second Frame)

As illustrated in in FIG. 1, the second frame 2 includes the second support portion 21 and a second beam portion 22 having an oscillating-body support portion 220. The second support portion 21 supports one end 22a (A2-direction end portion) of the second beam portion 22. The second frame 2 has a first portion 21a and a second portion 21b.

Figure 2:
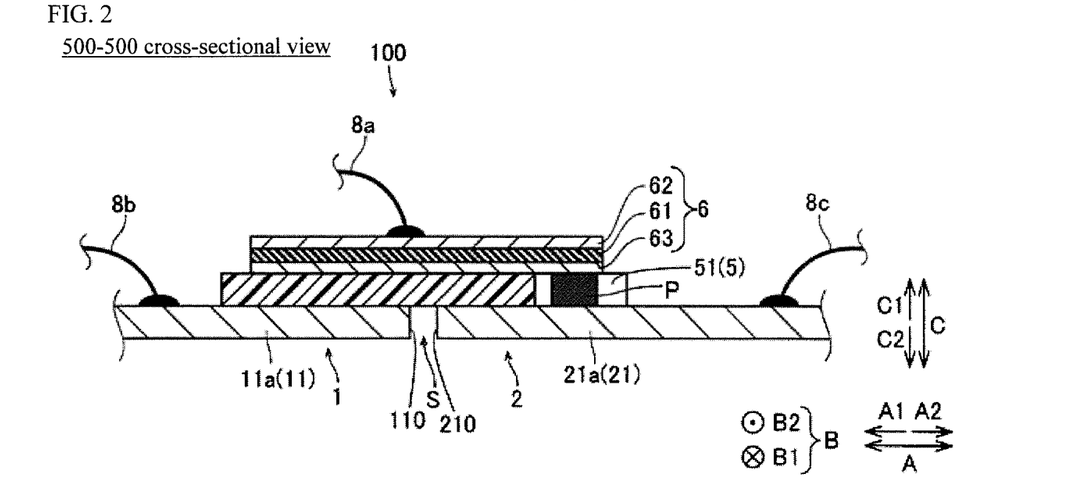
FIG. 2 is a schematic cross-sectional view at line 500-500 in FIG. 1.

As illustrated in FIG. 2, the second frame 2 is disposed on an A2-direction side of the first frame 1. An edge portion 110 on an A2-direction side of the first portion 11a of the first frame 1 and an edge portion 210 on an A1-direction side of the first portion 21a of the second frame 2 both extend in the B direction and are disposed opposing each other. Because of this, the space S of the certain width extending in the B direction is formed between the edge portion 110 and the edge portion 210. As above, the second frame 2 has a shape symmetrical to the first frame 1 and includes a similar configuration. As such, detailed description of the second frame 2 is omitted.

(Configuration of Oscillating Body)

Figure 3:
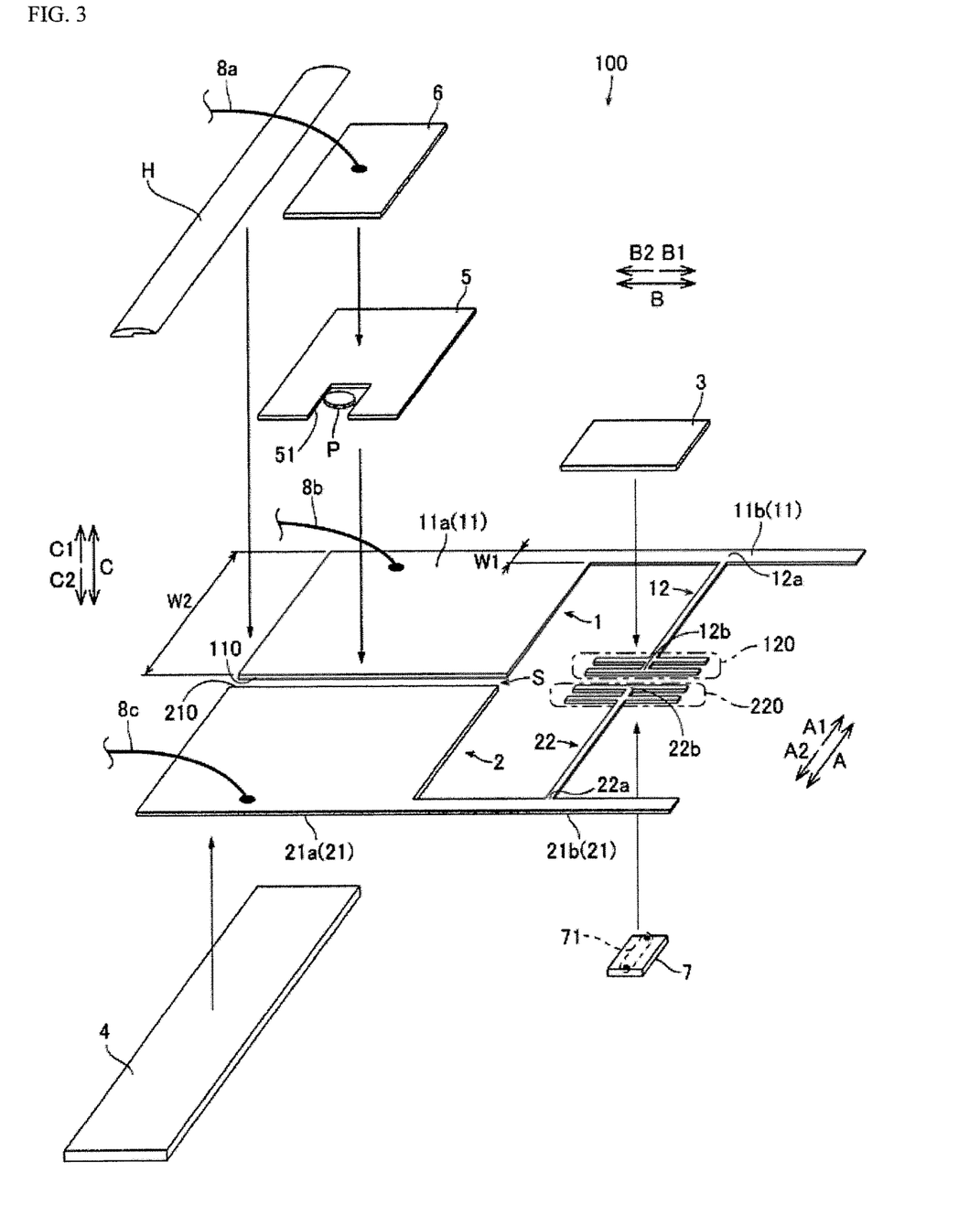
FIG. 3 is an exploded perspective view illustrating the vibrating element of the first embodiment of the present invention.

As illustrated in FIG. 3, the oscillating body 3 is installed on the other end 12b of the first beam portion 12 (oscillating-body support portion 120) and the other end 22b of the second beam portion 22 (oscillating-body support portion 220) from a C1-direction side so the first beam portion 12 of the first frame 1 and the second beam portion 22 of the second frame 2 connect in an insulated state. The oscillating body 3 is formed as an insulated substrate. The substrate oscillating body 3 contacts the first frame 1 and the second frame 2 and has a rectangular shape. Therefore, in the vibrating element 100, the first frame 1 and the second frame 2 are not electrically connected via the oscillating body 3 (substrate portion). The oscillating body 3 may include a mirror-face portion (reflective-face portion) that is provided on a C1-direction end portion of the substrate portion and reflects light. The mirror-face portion is formed by aluminum vapor deposition or the like.

As illustrated in FIG. 1, the oscillating body 3 is disposed having substantial linear symmetry across the centerline C of the space S.

(Configuration of Holding Member)

As illustrated in FIG. 1, the holding member 4 holds the first frame 1 and the second frame 2 in a separated state. That is, it fixes relative positions of the first frame 1 and the second frame 2. The holding member 4 is insulated. The holding member 4 is disposed on a face on an opposite side (C2-direction side) of a piezoelectric-element 6 side of the first support portion 11 of the first frame 1 and the second support portion 21 of the second frame 2. The holding member 4 may be disposed in an area that does not impede transmission of a driving force of the second portions 11b and 21b.

The holding member 4 extends in the same direction (A direction) as the first beam portion 12 of the first frame 1 and the second beam portion 22 of the second frame 2. The holding member 4 is provided extending along edge portions in the B2 direction of the first support portion 11 and the second support portion 21. The holding member 4 is fixed to the first frame 1 and the second frame 2 by an adhesive H coated from the C1-direction side between the first frame 1 and the second frame 2.

The holding member 4 is disposed having substantial linear symmetry across the centerline C of the space S. An insulating member may be filled in the space S. The first frame 1 and the second frame 2 may be insulated by the insulating member.

(Configuration of Insulating Film and Piezoelectric Element)

As illustrated in FIG. 1, the insulating film 5 and the piezoelectric element 6 are disposed straddling the first support portion 11 and the second support portion 21. The insulating film 5 is insulated. The insulating film 5 is disposed between the piezoelectric element 6 and the first frame 1 (first support portion 11) and second frame 2 (second support portion 21) in the C direction.

Specifically, the insulating film 5 and the piezoelectric element 6 are stacked in order of the insulating film 5 and the piezoelectric element 6 on a face on the C1-direction side of the first support portion 11 and the second support portion 21. Because of this, the piezoelectric element 6 is separated from the first support portion 11 and the second support portion 21 and is insulated from the first support portion 11 and the second support portion 21 by the insulating film 5. The insulating film 5 is formed of paraffin paper or the like.

The insulating film 5 is adhered to the piezoelectric element 6 and the first frame 1 and second frame 2 by an adhesive (not illustrated).

As illustrated in FIG. 2, the piezoelectric element 6 is configured to subject the oscillating body 3 to vibrational driving via the first frame 1 and the second frame 2. The piezoelectric element 6 includes a plate-shaped piezoelectric body 61, an upper electrode 62, and a lower electrode 63. The upper electrode 62 is provided on an upper face (face on a C1-direction side) of the piezoelectric body 61. The lower electrode 63 is provided on a lower face (face on a C2-direction side) of the piezoelectric body 61.

In a position of the insulating film 5 interposed by the lower electrode 63 and the second frame 2, a notch portion 51 disposed with a conductive portion P on an inner side is provided. The conductive portion P is a conductive portion formed of silver paste or the like and contacts both a lower face (face on the C2-direction side) of the lower electrode 63 and the second frame 2. Because of this, the lower electrode 62 and the second frame 2 are electrically connected by the conductive portion P. The conductive portion P does not contact the first frame 1. The notch portion 51 is one example of "opening portion" in the claims.

As illustrated in FIG. 1, the piezoelectric element 6 is disposed having substantial linear symmetry across the centerline C of the space S.

(Configuration of LED Light Source)

As illustrated in FIG. 3, the LED light source 7 is provided between the other end 12b of the first beam portion 12 and the other end 22b of the second beam portion 22. Specifically, the LED light source 7 is installed on the first beam portion 12 and the second beam portion 22 from the C2-direction side so as to connect the first beam portion 12 and the second beam portion 22.

The LED light source 7 has a pair of terminals 71 contacting the first beam portion 12 and the second beam portion 22. Each terminal 71 is connected to an LED (not illustrated) via wiring (not illustrated) inside the LED light source 7. The LED light source 7 is configured to be supplied with power via the first frame 1.

(Configuration of Wiring)

As illustrated in FIG. 1, the wiring 8a is connected to the upper electrode 62. The wiring 8a is configured to supply AC power to the upper electrode 62 (see FIG. 2) from a power source (not illustrated). The wiring 8a is formed of bonding wire or the like.

The wiring 8b is connected to the first support portion 11 of the first frame 1. The wiring 8b is configured to supply AC power to the first frame 1 from a power source (not illustrated). The wiring 8b is formed of bonding wire or the like.

The wiring 8c is connected to the second support portion 21 of the second frame 2. The wiring 8c fixes the second frame 2 at a predetermined potential. Specifically, the wiring 8c connects the second frame 2 to a ground. The wiring 8c is formed of bonding wire or the like.

The vibrating element 100 is configured to supply power to the LED light source 7 by providing a potential difference between the first frame 1 and the second frame 2 by the wiring 8a and the wiring 8c.

Effects of First Embodiment

In the first embodiment of the present invention, effects such as the following can be obtained.

In the first embodiment of the present invention, as above, the LED light source 7 that is installed on the oscillating body 3, which connects the first beam portion 12 and the second beam portion 22 in the insulated state, and is supplied with power via the conductive first frame 1 and the conductive second frame 2 is provided. As such, power can be supplied to the LED light source 7 via the first beam portion 12 per se of the first frame 1 and the second beam portion 22 per se of the second frame 2. Therefore, when supplying power to the LED light source 7 provided on the oscillating body 3 of the first beam portion 12 and the second beam portion 22, there is no need to provide wiring on the first beam portion 12 and the second beam portion 22. Because of this, a simple structure can be readily manufactured even when power is supplied to the LED light source 7 provided on the oscillating body 3.

Furthermore, in the first embodiment of the present invention, as above, further provided is the piezoelectric element 6 that is disposed straddling the first support portion 11 and the second support portion 21 and subjects the oscillating body 3 to vibrational driving via the first frame 1 and the second frame 2. This enables a driving force from the piezoelectric element 6 to be transmitted in a balanced manner to the first support portion 11 and the second support portion 21 compared to a situation where the piezoelectric element 6 is disposed only on one side among the first support portion 11 and the second support portion 21. As a result, the oscillating body 3 can be subjected to stable vibrational driving via the first frame 1 and the second frame 2.

Furthermore, in the first embodiment of the present invention, as above, between the first frame 1 and the second frame 2, the space S extending in the B direction is provided, and the first frame 1 and the second frame 2 are disposed having substantial linear symmetry with each other across the centerline C of the space S extending in the B direction. This enables the drive force from the piezoelectric element 6 to be transmitted in a balanced manner to the first support portion 11 and the second support portion 21. As a result, the oscillating body 3 can be subjected to vibrational driving with greater stability via the first frame 1 and the second frame 2.

Furthermore, in the first embodiment of the present invention, as above, further provided is the insulating film 5 that is disposed between the piezoelectric element 6 and the first frame 1 and second frame 2 and at least provides insulation between the piezoelectric element 6 and the first frame 1. This prevents continuity between the first frame 1 and the second frame 2 via the piezoelectric element 6 (lower electrode 63). If there is continuity between the first frame 1 and the second frame 2, the first frame 1 and the second frame 2 come to have equal potentials. This prevents the first frame 1 and the second frame 2 from being used as conductive members of a circuit supplying power to the LED light source 7.

Furthermore, in the first embodiment of the present invention, as above, the piezoelectric element 6 includes the plate-shaped piezoelectric body 61, the upper electrode 62 provided on the upper face of the piezoelectric body 61, and the lower electrode 63 provided on the lower face of the piezoelectric body 61, the vibrating element further provided with the wiring 8a that is connected to the upper electrode 62 and supplies power to the upper electrode 62, the wiring 8b that is connected to the first frame 1 and supplies power to the first frame 1, the wiring 8c that is connected to the second frame 2 and fixes the second frame 2 at the predetermined potential, and the conductive portion P electrically connecting the second frame 2 and the lower electrode 63. This enables the piezoelectric body 61 to be defaulted by the wiring 8a to subject the oscillating body 3 to vibrational driving. Moreover, by the wiring 8b and the wiring 8c, the first frame 1 and the second frame 2 can be used as conductive members of a circuit supplying power to the LED light source 7.

Furthermore, in the first embodiment of the present invention, as above, in the position of the insulating film 5 interposed by the lower electrode 63 and the second frame 2, the notch portion 51 disposed with the conductive portion P on the inner side is provided. This enables the conductive portion P to be disposed on the inner side of the notch portion 51. Therefore, the conductive portion P can contact the lower electrode 63 by a surface of the conductive portion P instead of by an edge portion thereof. That is, the lower electrode 63 and the conductive portion P can have a reliable electrical connection. As a result, the lower electrode 63 and the second frame 2 can have a reliable electrical connection via the conductive portion P. This enables the notch portion 51 to provide a portion where the lower electrode 63 does not make surface contact with the insulating film 5, ensure an empty portion between a surface of the lower electrode 63 and the second frame 2, and expose a surface of a portion on a second-frame 2 side of the lower electrode 63. Therefore, the conductive portion P can be disposed on the inner side of the notch portion 51 so as to contact both the surface of the lower electrode 63 and the second frame 2. As a result, the conductive portion P and the lower electrode 63 and conductive portion P can be caused to make surface contact so the lower electrode 63 and the conductive portion P have a reliable electrical connection.

Furthermore, in the first embodiment of the present invention, as above, the vibrating element is configured to supply power to the LED light source 7 by providing the potential difference between the first frame 1 and the second frame 2. This enables a current to be flowed from the first frame 1 to the second frame 2 or from the second frame 2 to the first frame 1 via the LED light source 7. That is, the first frame 1 and the second frame 2 can be used as conductive members of a circuit supplying power to the LED light source 7.

Furthermore, in the first embodiment of the present invention, as above, the LED light source 7 is provided. This enables the LED light source 7 to be subjected to vibrational driving. As such, by light from the LED light source 7, a deflection angle of the oscillating body 3 can be readily grasped visually and luminous intensity distribution characteristics (range of radiation) can be varied.

Furthermore, in the first embodiment of the present invention, as above, the first support portion 11 and the second support portion 21 each have, in the plane wherein the first support portion 11 and the second support portion 21 are provided, the first portions 11a, 21a that extend in the B direction substantially orthogonal to the A direction wherein the first beam portion 12 and the second beam portion 22 extend and have the edge portions 110 and 210 disposed opposing each other and the second portions 11b, 21b that support the first beam portion 12 and the second beam portion 22; protrude in the B direction from the first portions 11a, 21a; and have an elongated shape with a smaller width in the A direction than the first portions 11a, 21a. This causes the second portions 11b, 21b, which are on an oscillating-body 3 side of the first portions 11a, 21a, to have an elongated shape. As such, the driving force of the piezoelectric element 6 can be more effectively transmitted to the oscillating body 3 compared to a situation where the second portions 11b, 21b are formed thicker than the first portions 11a, 21a.

Furthermore, in the first embodiment of the present invention, as above, further provided are the insulated holding member 4 holding the first frame 1 and the second frame 2 in a separated state and the piezoelectric element 6 that subjects the oscillating body 3 to vibrational driving via the first frame 1 and the second frame 2, wherein the piezoelectric element 6 is provided on one face side of the first support portion 11 and the second support portion 21, and the holding member 4 is disposed on the face on the opposite side of the piezoelectric-element 6 side of the first support portion 11 and the second support portion 21 and is provided extending along edge portions extending in the same direction as the first beam portion 12 and the second beam portion 22. This enables the holding member 4 to hold the first frame 1 and the second frame 2 in a separated state in a position that does not interfere with the piezoelectric element 6.

Furthermore, in the first embodiment of the present invention, as above, further provided are the insulated holding member 4 holding the first frame 1 and the second frame 2 in a separated state and the piezoelectric element 6 that subjects the oscillating body 3 to vibrational driving via the first frame 1 and the second frame 2, wherein between the first frame 1 and the second frame 2, the space S of the certain width extending in the B direction is provided, and the piezoelectric element 6, the holding member 4, and the oscillating body 3 are disposed having substantial linear symmetry across the centerline C of the space S extending in the B direction. This enables the drive force from the piezoelectric element 6 to be transmitted in a balanced manner to the piezoelectric element 6, the holding member 4, and the oscillating body 3. As a result, the oscillating body 3 can be subjected to vibrational driving with greater stability via the first frame 1 and the second frame 2.

Furthermore, in the first embodiment of the present invention, as above, the first beam portion 12 and the second beam portion 22 respectively have the oscillating-body support portions 120 and 220 that extend in the B direction and have the oscillating body 3 installed thereon at the other end 12b of the first beam portion 12 and the other end 22b of the second beam portion 22. This enables the oscillating-body support portions 120 and 220 to support the oscillating body 3 over a greater area. As such, the oscillating body 3 can be stably supported.

Second Embodiment

Next, a configuration of a vibrating element 200 according to a second embodiment of the present invention is described with reference to FIGS. 4 and 5. This vibrating element 200 in the second embodiment of the present invention differs from the first embodiment of the present invention, which electrically connects the lower electrode 63 and the second frame 2; an example is described where the lower electrode 63 and the second frame 2 are insulated. Configurations similar to the first embodiment of the present invention are illustrated labeled with the same reference signs as the first embodiment of the present invention and description thereof is omitted.

Figure 4:
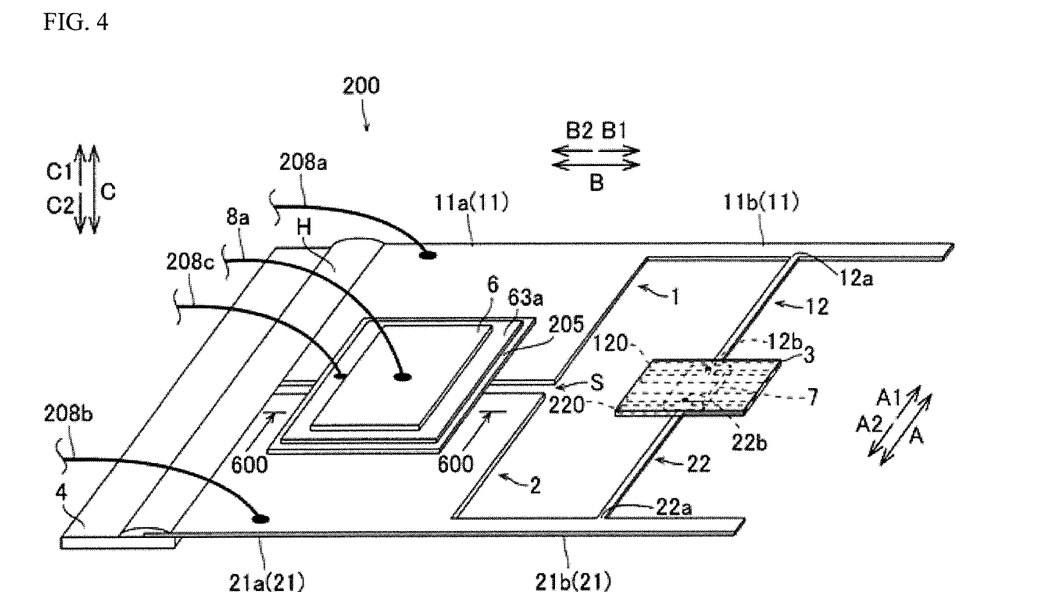
FIG. 4 is a perspective view illustrating a vibrating element of a second embodiment of the present invention.

As illustrated in FIG. 4, the vibrating element 200 of the second embodiment of the present invention includes an insulating film 205; a conductive plate 63a; and wiring 208a, 208b, and 208c. The wiring 208a, 208b, and 208c are respectively one example of "fourth wiring," "fifth wiring," and "sixth wiring" in the claims.

The insulating film 205 is disposed between the conductive plate 63a and the first frame 1 and second frame 2 in the C direction. The insulating film 205 is insulated. Unlike the insulating film 5 of the first embodiment of the present invention, the insulating film 205 does not have the notch portion 51 and is formed in a rectangular shape. That is, the first frame 1 and the second frame 2 are insulated from the piezoelectric element 6 by the insulating film 205.

Figure 5:
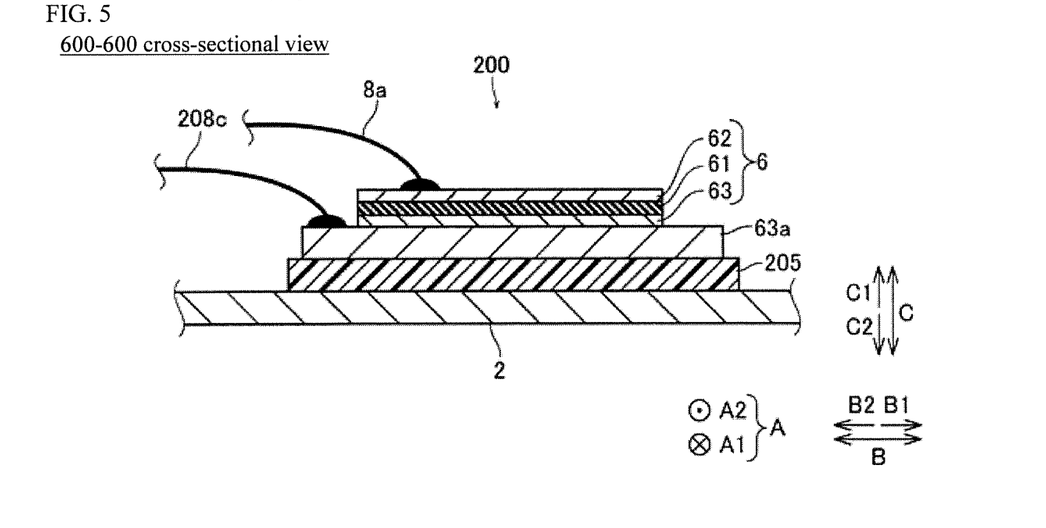
FIG. 5 is a schematic cross-sectional view at line 600-600 in FIG. 4.

As illustrated in FIG. 5, the conductive plate 63a is disposed between the lower electrode 63 and the insulating film 205 in the C direction. The conductive plate 63a is conductive. The wiring 208c is connected to an edge portion of the conductive plate 63a. The wiring 208c is formed of bonding wire or the like. The conductive plate 63a has a function of transmitting power from the wiring 208c to the lower electrode 63.

The wiring 208a is connected to the first frame 1. The wiring 208b is connected to the second frame 2. The wiring 208a is used to supply power of a predetermined first potential to the first frame 1. The wiring 208b is used to supply power of a predetermined second potential to the second frame 2. For example, power of a potential of 5 V is supplied to the first frame 1 from the wiring 208a and power of a potential of −5 V is supplied to the second frame 2 from the wiring 208a.

Effects of Second Embodiment

In the second embodiment of the present invention, effects such as the following can be obtained.

In the second embodiment of the present invention, as above, the piezoelectric element 6 includes the plate-shaped piezoelectric body 61, the upper electrode 62 provided on the upper face of the piezoelectric body 61, and the lower electrode 63 provided on the lower face of the piezoelectric body 61, and the insulating film 205 is configured to insulate the piezoelectric element 6 and both the first frame 1 and the second frame 2, the vibrating element further provided with the wiring 8a that is connected to the upper electrode 62 and supplies power to the upper electrode 62, the wiring 208a that is connected to the first frame 1 and supplies power of the predetermined first potential to the first frame 1, the wiring 208b that is connected to the second frame 2 and supplies power of the predetermined second potential that differs from the first potential to the second frame 2, and the wiring 208c that is connected to the lower electrode 63 and supplies power to the lower electrode 63. This enables power to be supplied to both the upper electrode 62 and the lower electrode 63 by the wiring 8a and the wiring 208c. As such, the piezoelectric body 61 can be deformed to a greater extent than a situation of supplying power to only one among the upper electrode 62 and the lower electrode 63.

Third Embodiment

Next, a configuration of a vibrating element 300 of a third embodiment of the present invention is described with reference to FIGS. 6 and 7. This vibrating element 300 in the third embodiment of the present invention differs from the first embodiment of the present invention, which insulates the upper electrode 62 of the piezoelectric element 6 from the first frame 1 and the second frame 2 and electrically connects the lower electrode 63 to the second frame 2; an example is described where two electrodes (first electrode 362, second electrode 363) provided by a piezoelectric element 306 are respectively electrically connected to the first frame 1 and the second frame 2. Configurations similar to the first embodiment of the present invention are illustrated labeled with the same reference signs as the first embodiment of the present invention and description thereof is omitted.

Figure 6:
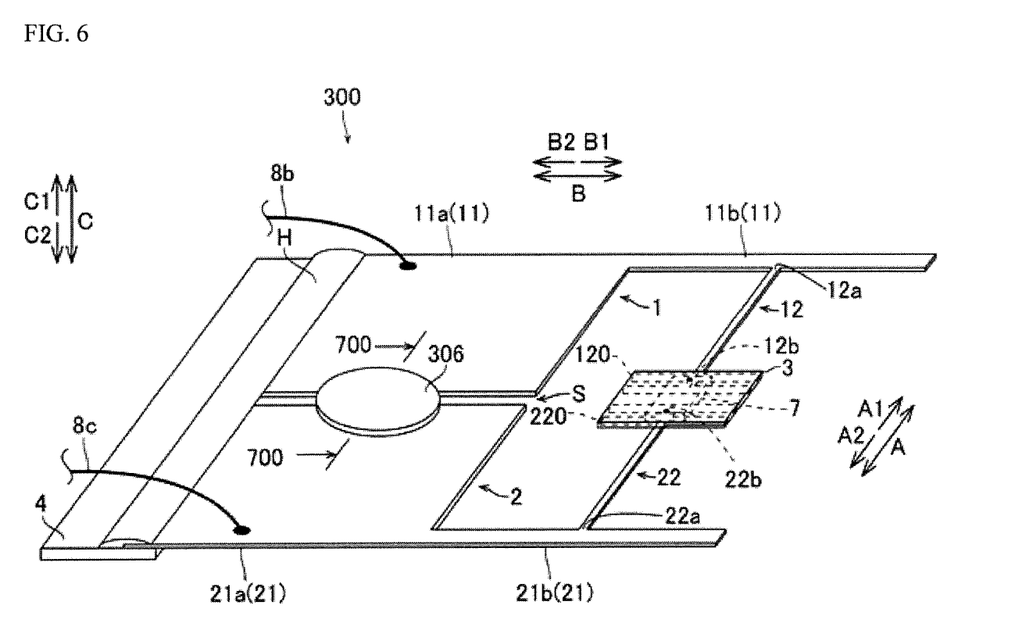
FIG. 6 is a perspective view illustrating a vibrating element of a third embodiment of the present invention.
Figure 7:
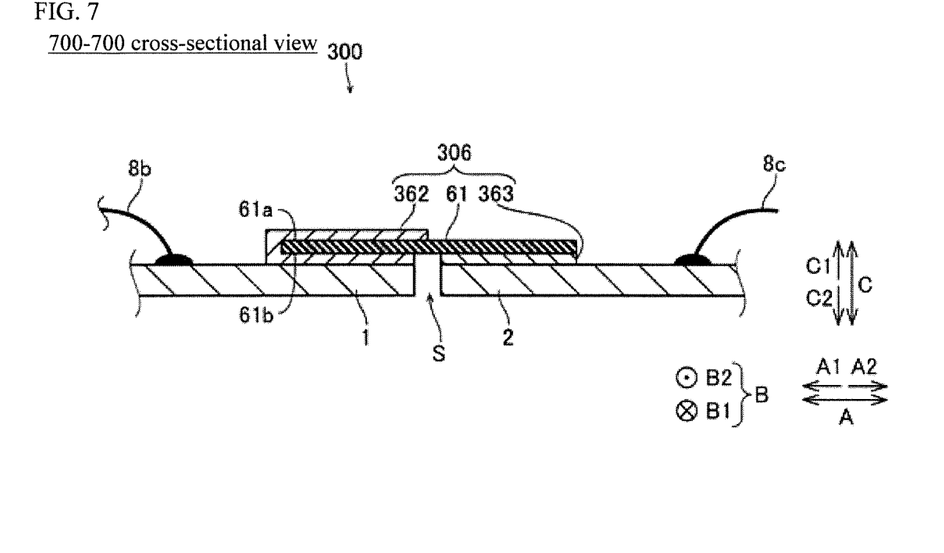
FIG. 7 is a schematic cross-sectional view at line 700-700 in FIG. 6.

As illustrated in FIG. 6, the vibrating element 300 of the third embodiment of the present invention includes the piezoelectric element 306. The vibrating element 300 is not provided with the insulating film 5 as in the first embodiment of the present invention.

The piezoelectric element 306 has a disk shape straddling the first frame 1 and the second frame 2. The piezoelectric element 306 includes the piezoelectric body 61, the first electrode 362, and the second electrode 363.

The first electrode 362 is provided straddling an upper face 61a (face on the C1-direction side) and a lower face 61b (face on the C2-direction side) of the piezoelectric body 61. Moreover, the first electrode 362 is provided on an A1-direction side of the piezoelectric body 61 and is disposed so as to directly contact the first frame 1. That is, the first electrode 362 is electrically connected to the first frame 1.

The first electrode 362 is not directly connected to wiring and is supplied with power from the wiring 8b via the first frame 1.

The second electrode 363 is provided on the lower face 61b (face on the C2-direction side) of the piezoelectric body 61. Moreover, the second electrode 363 is provided on an A2-direction side of the piezoelectric body 61 and is disposed so as to directly contact the second frame 2. That is, the second electrode 363 is electrically connected to the second frame 2. The second electrode 363 is not directly connected to wiring and is supplied with power from the wiring 8c via the second frame 2.

Effects of Third Embodiment

In the third embodiment of the present invention, effects such as the following can be obtained.

In the third embodiment of the present invention, as above, further provided are the wiring 8b that is connected to the first frame 1 and supplies power to the first frame 1 and the wiring 8c that is connected to the second frame 2 and fixes the second frame 2 at the predetermined potential, wherein the piezoelectric element 306 includes the plate-shaped piezoelectric body 61, the first electrode 362 provided straddling the upper face 61a and the lower face 61b of the piezoelectric body 61 in a state of being electrically connected to the second frame 2, and the second electrode 363 provided on the lower face 61b of the piezoelectric body 61 in a state of being electrically connected to the first frame 1. This enables deformation of the piezoelectric body 61 and power supply to the LED light source 7 by two wirings alone. That is, wiring for power supply to the first electrode 362 and the second electrode 363 and wiring for power supply to the LED light source 7 can be consolidated to simplify a wiring configuration. Moreover, because the piezoelectric body 61 is generally thin and brittle, disposing an electrode thereon increases a risk of damage such as cracking of the piezoelectric body 61. Moreover, by taking the wiring out from the B1 direction in FIG. 7, the C direction can be made very thin By this, a device thickness can be decreased, which improves a level of freedom in arrangement.

(Variations)

Embodiments of the present invention disclosed herein are examples on all counts and should not be considered limiting. The scope of the present invention is indicated not by the above description of the embodiments but by the claims and includes meanings equivalent to the claims and all modifications (variations) within the scope of the claims.

For example, the first to third embodiments of the present invention illustrate an example where the first frame and the second frame are disposed with an empty portion therebetween. However, the present invention is not limited thereto. In one or more embodiments of the present invention, an insulated spacer may be disposed in the space between the first frame and the second frame. The spacer can ensure insulation between the first frame and the second frame. Moreover, because the spacer can fill the space between the first frame and the second frame, the vibrating element can be readily manufactured and durability can be improved.

Furthermore, the first to third embodiments of the present invention illustrate an example where a piezoelectric element is disposed straddling the first support portion and the second support portion. However, the present invention is not limited thereto. In one or more embodiments of the present invention, the piezoelectric element may be disposed on only one among the first support portion and the second support portion.

Furthermore, the first to third embodiments of the present invention illustrate an example where the first frame and the second frame are disposed having substantial linear symmetry with each other across the centerline of the space. However, the present invention is not limited thereto. In one or more embodiments of the present invention, the first frame and the second frame do not have to be disposed having substantial linear symmetry with each other across the centerline of the space.

Furthermore, the first to third embodiments of the present invention illustrate an example where the power-consuming member according to one or more embodiments of the present invention is the LED light source. However, the present invention is not limited thereto. In one or more embodiments of the present invention, the power-consuming member of the present invention may be a configuration other than the LED light source, such as an acceleration sensor, a laser light source, a heater, a temperature sensor, or a coil.

Furthermore, the first to third embodiments of the present invention illustrate an example where the insulating film is formed of paraffin paper or the like. However, the present invention is not limited thereto. In one or more embodiments of the present invention, the insulating film according to one or more embodiments of the present invention may be provided by forming an oxide film on the lower electrode or a portion of the first frame and second frame. That is, the insulating film may be formed of a configuration other than paraffin paper, such as an oxide film.

Furthermore, the first to third embodiments of the present invention illustrate an example where the first support portion of the first frame and the second support portion of the second frame are each formed in an L shape. However, the present invention is not limited thereto. For example, in one or more embodiments of the present invention, the first support portion of the first frame and the second support portion of the second frame may be formed in a shape other than an L shape, such as a C shape.

Furthermore, the first to third embodiments of the present invention illustrate an example where the oscillating-body support portion is formed in an H shape. However, the present invention is not limited thereto. In one or more embodiments of the present invention, the oscillating-body support portion may be formed in a shape other than an H shape, such as a disk.

Furthermore, the first embodiment of the present invention illustrates an example where the opening portion is provided in the insulating film. However, the present invention is not limited thereto. In one or more embodiments of the present invention, the insulating film does not have to be provided with the opening portion. In this situation, the conductive portion needs to be disposed so an edge portion of the lower electrode and the second frame have continuity.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

1 First frame
2 Second frame
3 Oscillating body
4 Holding member
5, 205 Insulating film
6, 306 Piezoelectric element (drive unit)
7 LED light source (power-consuming member)
8a Wiring (first wiring)
8b Wiring (second wiring)
8c Wiring (third wiring)
11 First support portion
11a First portion (of first frame)
11b Second portion (of first frame)
12 First beam portion
12a One end (of first beam portion)
12b Other end (of first beam portion)
21 Second support portion
21a First portion (of second frame)
21b Second portion (of second frame)
22 Second beam portion
22a One end (of second beam portion)
22b Other end (of second beam portion)
51 Notch portion (opening portion)
61 Piezoelectric body
61a Upper face
61b Lower face
62 Upper electrode
63 Lower electrode
100, 200, 300 Vibrating element
110 Edge portion (of first frame disposed opposing edge portion of second frame)
120 Oscillating-body support portion (of first frame)
208a Wiring (fourth wiring)
208b Wiring (fifth wiring)
208c Wiring (sixth wiring)
210 Edge portion (of second frame disposed opposing edge portion of first frame)
220 Oscillating-body support portion (of second frame)
362 First electrode
363 Second electrode
C Centerline
P Conductive portion
S Space

What is claimed is:

1. A vibrating element, comprising:
   a conductive first frame including a first beam portion and a first support portion supporting one end of the first beam portion;
   a conductive second frame that includes a second beam portion and a second support portion supporting one end of the second beam portion and is disposed separated from the conductive first frame;
   an oscillating body that is disposed between another end of the first beam portion and another end of the second beam portion and connects the first beam portion and the second beam portion in an insulated state; and
   a power-consuming member that is installed on the oscillating body and is supplied with power via the conductive first frame and the conductive second frame.

2. The vibrating element of claim 1, wherein the vibrating element is configured to supply power to the power-consuming member by providing a potential difference between the conductive first frame and the conductive second frame.

3. The vibrating element of claim 1, wherein the power-consuming member includes at least one among an LED light source, a laser light source, an acceleration sensor, a heater, a temperature sensor, and a coil.

4. The vibrating element of claim 1,
   wherein each of the first support portion and the second support portion has a first portion and a second portion, wherein the first portion and the second portion of the first support portion and the first portion and the second portion of the second support portion are provided in a plane where the first support portion and the second support portion are provided, wherein the first portion of the first support portion and the first portion of the second support portion extend in a second direction substantially orthogonal to a first direction where the first beam portion and the second beam portion extend, wherein an edge portion of the first portion of the first support portion opposes an edge portion of the first portion of the second support portion, wherein the second portion of the first support portion supports the first beam portion, wherein the second portion of the second support portion supports the second beam portion, wherein the second portion of the first support portion protrudes in the second direction from the first portion of the first support portion, wherein the second portion of the second support portion protrudes in the second direction from the second portion of the second support portion, wherein the second portion of the first support portion has a first elongated shape with a first width in the first direction that is smaller than a width of the first portion of the first support portion, and wherein the second portion of the second support portion has a second elongated shape with a second width in the first direction that is smaller than a width of the first portion of the second support portion.

5. The vibrating element of claim 1, further comprising:
an insulated holding member holding the conductive first frame and the conductive second frame in a separated state; and
a drive unit that subjects the oscillating body to vibrational driving via the conductive first frame and the conductive second frame;
wherein the drive unit is provided on one face side of the first support portion and the second support portion, and
wherein the insulated holding member is disposed on a face on an opposite side of the drive unit side of the first support portion and the second support portion and extends along edge portions of the first support portion and the second support portion that extend in the same direction as the first beam portion and the second beam portion.

6. The vibrating element of claim 1,
wherein each of the first beam portion and the second beam portion has an oscillating-body support portion that extends in a plane in a direction intersecting a first direction where the first beam portion and the second beam portion extends,
wherein the first support portion and the second support portion are provided in the plane,
wherein the oscillating body is installed on the oscillating-body support portion, and
wherein the oscillating-body support portion is disposed at the other end of the first beam portion and the other end of the second beam portion.

7. The vibrating element of claim 1, further comprising:
an insulated holding member holding the conductive first frame and the conductive second frame in a separated state; and
a drive unit that subjects the oscillating body to vibrational driving via the conductive first frame and the conductive second frame,
wherein, between the conductive first frame and the conductive second frame, a space of a certain width extending in a second direction orthogonal to a first direction, wherein the first beam portion and the second beam portion extend, is provided in a plane wherein the first support portion and the second support portion are provided, and
wherein the drive unit, the insulated holding member, and the oscillating body are disposed having substantial linear symmetry across a centerline of the space extending in the second direction.

8. The vibrating element of claim 7, further comprising:
an insulated spacer ensuring the space by contacting the conductive first frame and the conductive second frame.

9. The vibrating element of claim 1, further comprising:
a drive unit that is disposed straddling the first support portion and the second support portion and subjects the oscillating body to vibrational driving via the conductive first frame and the conductive second frame.

10. The vibrating element of claim 9, further comprising:
second wiring that is connected to the conductive first frame and supplies power to the conductive first frame; and
third wiring that is connected to the conductive second frame and fixes the conductive second frame at a predetermined potential,
wherein the drive unit includes a piezoelectric body, a first electrode provided straddling an upper face and a lower face of the piezoelectric body in a state of being electrically connected to the conductive second frame, and a second electrode provided on the lower face of the piezoelectric body in a state of being electrically connected to the conductive first frame.

11. The vibrating element of claim 9, further comprising:
second wiring that is connected to the conductive first frame and supplies power to the conductive first frame; and
third wiring that is connected to the conductive second frame and fixes the conductive second frame at a predetermined potential,
wherein the drive unit includes a piezoelectric body, a first electrode provided straddling an upper face and a lower face of the piezoelectric body in a state of being electrically connected to the conductive second frame, and a second electrode provided on the lower face of the piezoelectric body in a state of being electrically connected to the conductive first frame.

12. The vibrating element of claim 9, wherein the vibrating element is configured to supply power to the power-consuming member by providing a potential difference between the conductive first frame and the conductive second frame.

13. The vibrating element of claim 9,
wherein between the conductive first frame and the conductive second frame, a space extending in a second direction substantially orthogonal to a first direction is provided in a plane,
wherein the first beam portion and the second beam portion extend in the first direction,
wherein the first support portion and the second support portion are provided in the plane, and
wherein the conductive first frame and the conductive second frame are disposed having substantial linear symmetry with each other across a centerline of the space extending in the second direction.

14. The vibrating element of claim 13, further comprising:
an insulating film that is disposed between the drive unit and the conductive first frame and the conductive second frame and at least provides insulation between the drive unit and the conductive first frame.

15. The vibrating element of claim 13, wherein the vibrating element is configured to supply power to the power-consuming member by providing a potential difference between the conductive first frame and the conductive second frame.

16. The vibrating element of claim 9, further comprising:
an insulating film that is disposed between the drive unit and the conductive first frame and the conductive second frame and at least provides insulation between the drive unit and the conductive first frame.

17. The vibrating element of claim 16,
wherein the drive unit includes a piezoelectric body, an upper electrode provided on an upper face of the piezoelectric body, and a lower electrode provided on a lower face of the piezoelectric body, and
wherein the insulating film is configured to insulate the drive unit and both the conductive first frame and the conductive second frame,
the vibrating element further comprising:
first wiring that is connected to the upper electrode and supplies power to the upper electrode;
fourth wiring that is connected to the conductive first frame and supplies power of a predetermined first potential to the conductive first frame;
fifth wiring that is connected to the conductive second frame and supplies power of a predetermined second potential that differs from the predetermined first potential to the conductive second frame; and
sixth wiring that is connected to the lower electrode and supplies power to the lower electrode.

18. The vibrating element of claim 16, wherein the vibrating element is configured to supply power to the power-consuming member by providing a potential difference between the conductive first frame and the conductive second frame.

19. The vibrating element of claim 16, wherein the drive unit includes a piezoelectric body, an upper electrode provided on an upper face of the piezoelectric body, and a lower electrode provided on a lower face of the piezoelectric body,
the vibrating element further comprising:
first wiring that is connected to the upper electrode and supplies power to the upper electrode;
second wiring that is connected to the conductive first frame and supplies power to the conductive first frame;
third wiring that is connected to the conductive second frame and fixes the conductive second frame at a predetermined potential; and
a conductive portion electrically connecting the conductive second frame and the lower electrode.

20. The vibrating element of claim 19, wherein the insulating film has an opening portion between the lower electrode and the conductive second frame, wherein the conductive portion is disposed inside the opening portion.

* * * * *